(12) United States Patent
Takano

(10) Patent No.: US 7,382,081 B2
(45) Date of Patent: Jun. 3, 2008

(54) ELECTRONIC COMPONENT PACKAGE

(75) Inventor: Atsushi Takano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 50 days.

(21) Appl. No.: 11/642,825

(22) Filed: Dec. 21, 2006

(65) Prior Publication Data

US 2007/0200462 A1 Aug. 30, 2007

(30) Foreign Application Priority Data

Feb. 27, 2006 (JP) ............................. 2006-049656

(51) Int. Cl.
*H01L 41/053* (2006.01)
(52) U.S. Cl. ....................................... 310/348; 310/340
(58) Field of Classification Search ................ 310/340, 310/348
See application file for complete search history.

(56) References Cited

U.S. PATENT DOCUMENTS

| 6,628,043 | B2 * | 9/2003 | Furukawa et al. | ...... 310/313 R |
| 6,798,121 | B2 * | 9/2004 | Nakatani et al. | ............. 310/340 |
| 6,914,367 | B2 * | 7/2005 | Furukawa | .................... 310/340 |
| 6,931,700 | B2 * | 8/2005 | Uchiyama | .................. 29/25.35 |

FOREIGN PATENT DOCUMENTS

JP    01-209811    8/1989

\* cited by examiner

*Primary Examiner*—Thomas M Dougherty
(74) *Attorney, Agent, or Firm*—Wenderoth, Lind & Ponack, L.L.P.

(57) ABSTRACT

In an electronic component package in which an electronic component mounted through an external electrode disposed on a mounting board is covered with a molding resin, the electronic component has a structure in which IDT electrodes disposed on the lower surface of a component substrate made of a piezoelectric material are covered with a component cover, and an intermediate elastic layer having an elastic modulus smaller than that of the component substrate and greater than that of the molding resin is provided between the component substrate and the molding resin.

3 Claims, 8 Drawing Sheets

ELECTRONIC COMPONENT PACKAGE

FIELD OF THE INVENTION

The present invention relates to electronic component packages in which a surface acoustic wave device, for example, is covered with molding resin.

BACKGOURND OF THE INVENTION

Unexamined Japanese Patent Publication No. H1-209811 discloses structure and manufacturing method of a surface acoustic wave (SAW) filter. FIG. 13 is a sectional view of a conventional electronic component package. This conventional electronic component package is one in which the packaged electronic component is SAW filter 201.

As shown in FIG. 13, this conventional electronic component package includes component substrate 202, IDT electrodes 203a, 203b of a surface acoustic wave device disposed on the under side of component substrate 202, and component cover 204 that covers lower part of component substrate 202. Cavity 205 is formed between IDT electrodes 203a, 203b and component cover 204 for the purpose of keeping vibration space of acoustic waves airtight.

With this SAW filter 201, an electrical signal supplied to IDT electrodes 203a is transmitted after being converted into surface acoustic waves and propagated on component substrate 202. Upon arrival at IDT electrodes 203b, the surface acoustic waves are converted back into an electrical signal. Frequency characteristics of SAW filter 201 dependent on the transmission characteristics of the surface acoustic waves are thus obtained.

Now, in addition to the surface acoustic waves, unwanted waves (called "bulk waves") that propagate inside component substrate 202 are also released from IDT electrodes 203a on the input side. These bulk waves are reflected on the sides and surfaces of component substrate 202 and arrive at IDT electrodes 203b on the output side. The reflection of the bulk waves on the sides and surfaces of component substrate 202 is greater the greater the difference in elastic modulus (or acoustic impedance) between component substrate 202 and surroundings (air in FIG. 13) of component substrate 202 is. Also, when the distance between IDT electrodes 203a and the sides or surfaces of component substrate 202 is short, the bulk waves arrive at IDT electrode 203b rarely being attenuated during the course. As a result, when the bulk waves become so large compared to the surface acoustic waves that they cannot be neglected and are detected by IDT electrodes 203b on the output side, the frequency characteristics of SAW filter 201 are deteriorated. As the size of the electronic component is made smaller, the distance between IDT electrodes 203a, 203b and the sides or surfaces of component substrate 202 becomes smaller, and deterioration of frequency characteristics due to bulk waves becomes more susceptible to occur.

SUMMARY OF THE INVENTION

The electronic component package in accordance with the present invention includes a mounting board, an external electrode disposed on the mounting board, an electronic component mounted on the mounting board through the external electrode, and molding resin that covers the electronic component on the mounting board. The electronic component has a component substrate made of a piezoelectric material, an IDT electrode disposed on the lower surface of the component substrate, and a component cover that covers lower part of the component substrate. An intermediate acoustic layer having an elastic modulus smaller than that of the component substrate and greater than that of the molding resin is provided between the component substrate and the molding resin.

With this structure, the elastic modulus becomes smaller (softer) starting from the inside of the electronic component toward the outside in the sequence of the component substrate, intermediate elastic layer, and the molding resin, and the acoustic impedance of the bulk waves smoothly shifts in this order. Accordingly, the bulk waves that arrive at the sides or surfaces of the component substrate smoothly propagate from the component substrate to the intermediate elastic layer, and from the intermediate elastic layer to the molding resin. As a result, the bulk waves generated at the IDT electrode on the input side and propagate inside the component substrate become difficult to arrive at the IDT electrode on the output side and the frequency characteristics of the electronic component can be improved.

DETAILED DESCRIPTION OF PREFERED EMBODIMENTS

First Exemplary Embodiment

Figure 1:
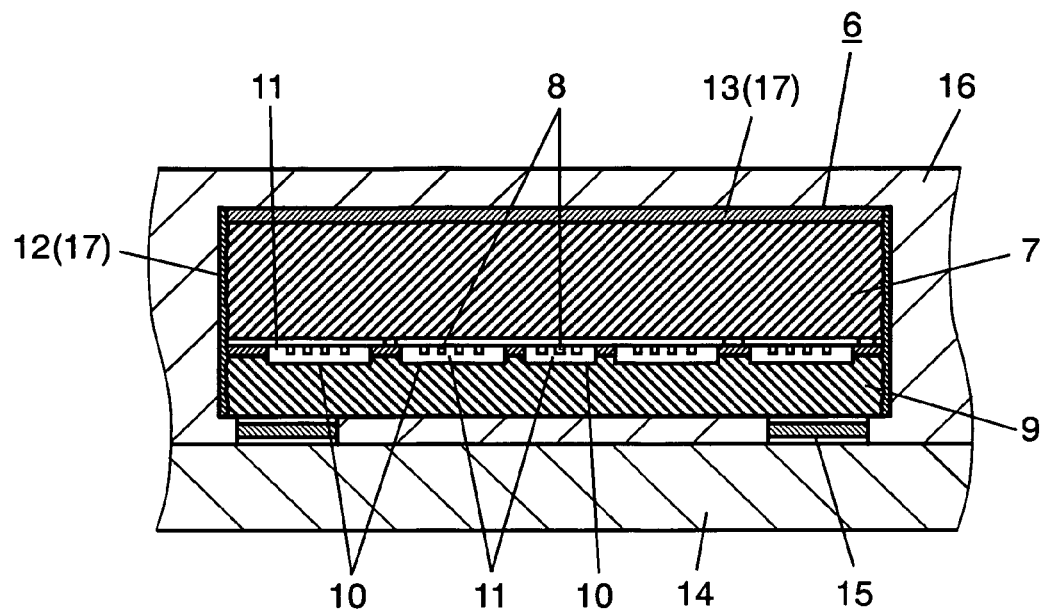
FIG. 1 is a sectional view of an electronic component package in a first exemplary embodiment.
Figure 2:
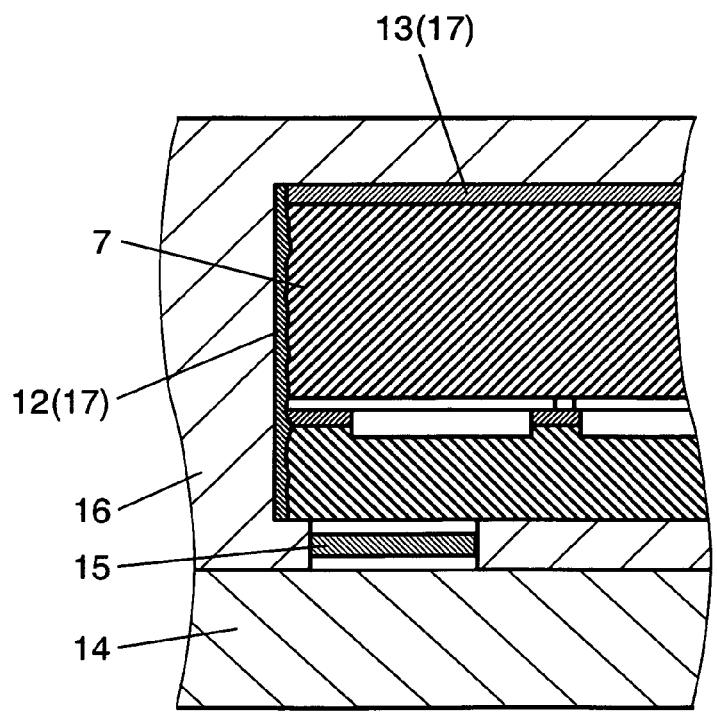
FIG. 2 is an enlarged partially sectional view of the electronic component package in the first exemplary embodiment.
Figure 3:
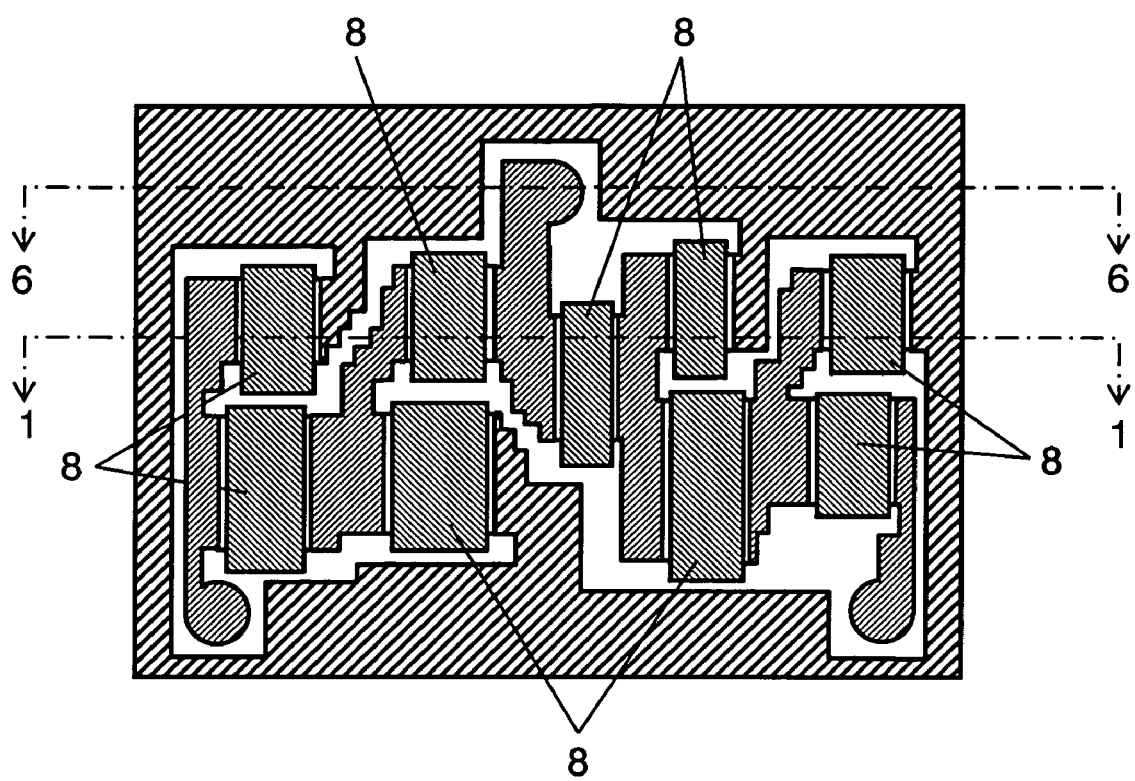
FIG. 3 is a bottom view of a component substrate in the first exemplary embodiment.

A description of an electronic component package in the first exemplary embodiment of the present invention will be given below with reference to drawings. FIG. 1 is a sectional view of the electronic component package in the first exemplary embodiment. FIG. 2 is an enlarged partially sectional view of the electronic component package in the first exemplary embodiment. FIG. 3 is a bottom view of a component substrate in the first exemplary embodiment. In the first exemplary embodiment, a description is given taking an acoustic wave device for antenna duplexer (hereinafter "SAW duplexer") 6 as an example.

As shown in FIG. 1, SAW duplexer 6 includes component substrate 7, IDT electrodes 8 that are disposed on the lower surface of component substrate 7 and function as a surface acoustic wave device, and component cover 9 that covers lower part of component substrate 7. SAW duplexer 6 also has recesses 10 provided on the part opposite IDT electrodes 8 on the top surface of component cover 9. Here, recesses 10 are for the purpose of forming cavities 11 that serve as vibration space for surface acoustic waves that propagate between IDT electrodes 8. Also, a side of component substrate 7 is work-affected layer 12, and protection layer 13 is disposed on the top surface of component substrate 7. Here, work-affected layer 12 means that part of the side surface of component substrate 7 where irregularities have been caused by plastic deformation due to the mechanical energy applied while cutting component substrate 7.

Furthermore, SAW duplexer 6 is mounted on mounting board 14 through external electrode 15 on mounting board 14 and is covered with molding resin 16 on mounting board 14, thereby forming an electronic component package. As above-mentioned molding resin 16, an epoxy resin having 80 to 90 wt % of $SiO_2$ as filler is used while an epoxy resin having 20 wt % of $SiO_2$ as filler is used as protection layer 13.

Also, in this exemplary embodiment, component substrate 7 is formed with $LiTaO_3$, component cover 9 is made of silicon, and IDT electrodes 8 are made of aluminum. As the material for component substrate 7, a piezoelectric material such as $LiNbO_3$ may be used. Also, as the material for IDT electrodes 8, other metallic materials may be used.

In addition, in this electronic component package, intermediate elastic layer 17 is formed in which the elastic modulus of work-affected layer 12 and protection layer 13 are smaller than the elastic modulus of component substrate 7 and greater than the elastic modulus of molding resin 16 is provided. By interposing intermediate elastic layer 17 between component substrate 7 and molding resin 16, deterioration of the frequency characteristics due to bulk waves can be reduced thereby improving the frequency characteristics of the electronic component.

That is, by interposing intermediate elastic layer 17 between component substrate 7 and molding resin 16, the electronic component package is designed in a manner such that intergradations of the elastic modulus in the path of release of bulk waves from component substrate 7 to molding resin 16 becomes gradually smaller. Accordingly, the elastic modulus smoothly changes from component substrate 7 to molding resin 16.

As a result, the acoustic impedance of the bulk waves smoothly changes in sequence from component substrate 7 to molding resin 16 with the intergradations of the elastic modulus. Therefore, the bulk waves generated at IDT electrodes 8 on the input side and arriving at a side or front face of component substrate 7 smoothly propagate from component substrate 7 to intermediate elastic layer 17, and further, from intermediate elastic layer 17 to molding resin 16, namely, to the outer side of the electronic component. Consequently, reflection of the bulk waves at the interface of the side or front face becomes difficult to take place. As a result, as the bulk waves generated at IDT electrodes 8 on the input side and propagated inside component substrate 7 become difficult to arrive at IDT electrodes 8 on the output side, the degradation of frequency characteristics due to the bulk waves is reduced thus resulting in improvement of the frequency characteristics of the electronic component.

In order to form intermediate elastic layer 17, work-affected layer 12 is employed on the side of component substrate 7. Also, on the top surface of component substrate 7, protection layer 13 is used. The reason for respectively using work-affected layer 12 and protection layer 13 is for the sake of productivity of the electronic component package. A method of manufacturing an electronic component package will be described in the following.

Figure 6:
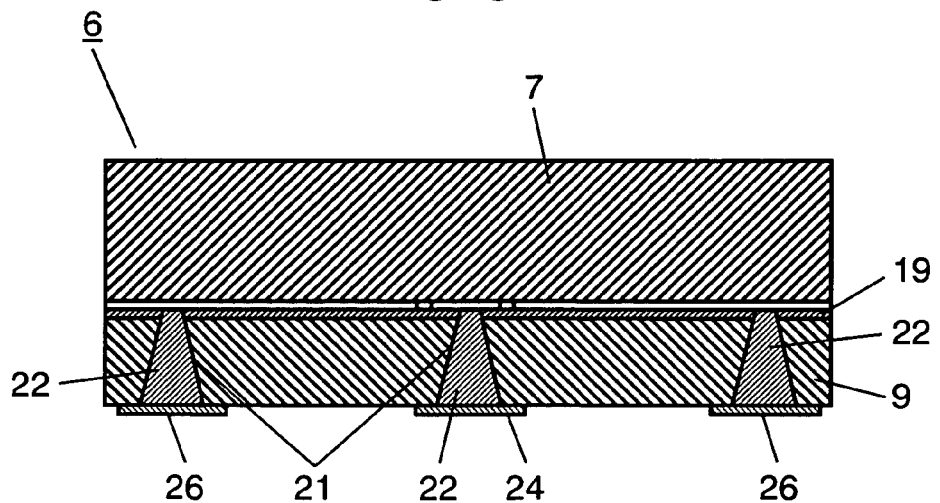
FIG. 6 is a sectional view of a SAW duplexer in the first exemplary embodiment.

In order to manufacture an electronic component package, a wafer-shaped component substrate 7 is first divided into plural areas. FIG. 3 is a bottom view of component substrate 7 in a first exemplary embodiment. FIG. 3 shows one of the divided areas. It shows the steps of depositing aluminum by sputtering over the entire lower surface of wafer-shaped component substrate 7 followed by forming electrode patterns of IDT electrodes 8 and so on by dry etching. Here, though it is general practice to dispose reflectors of parallely arranged short-circuit electrodes at both ends of IDT electrodes 8, the reflectors are omitted in the drawing for simplification. By the way, the sectional view taken along the direction of arrow 1 is as shown in FIG. 1 and the sectional view taken along the direction of arrow 6 is as shown in FIG. 6.

Figure 4A:
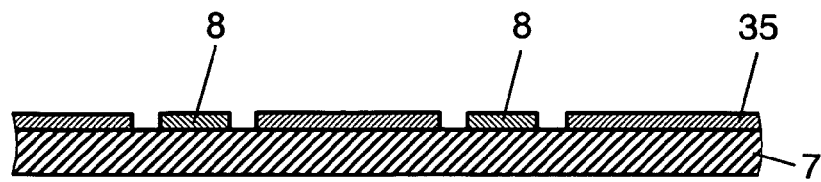
FIG. 4A is a manufacturing process diagram of a SAW duplexer in the first exemplary embodiment.
Figure 4B:
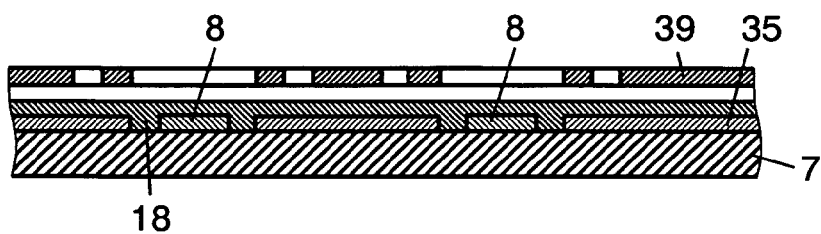
FIG. 4B is a manufacturing process diagram of a SAW duplexer in the first exemplary embodiment.
Figure 4C:
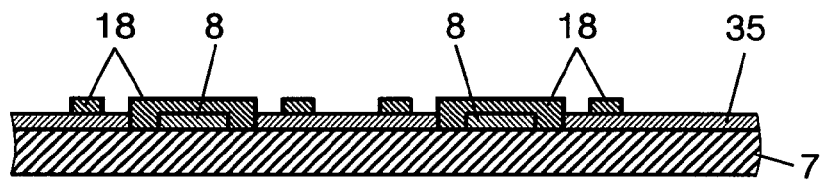
FIG. 4C is a manufacturing process diagram of a SAW duplexer in the first exemplary embodiment.

In the step shown in FIG. 4A, predetermined electrode patterns of IDT electrodes 8 and extraction electrode 35 are formed on wafer-shaped component substrate 7. In the subsequent step shown in FIG. 4B, photosensitive resin layer 18 is formed over the entire component substrate 7. Then the portions other than predetermined electrode patterns such as IDT electrodes 8 are masked with mask 39, exposed and developed. As a result, only non-masked portions of photosensitive resin layers 18 are hardened and remain, and masked portions do not remain as shown in FIG. 4C.

Figure 4D:
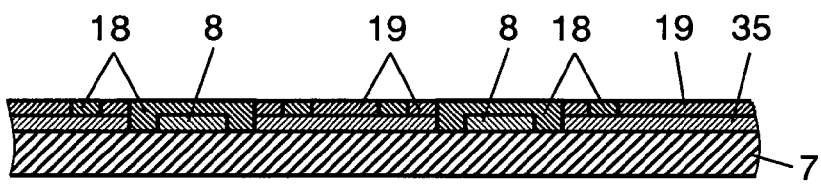
FIG. 4D is a manufacturing process diagram of a SAW duplexer in the first exemplary embodiment.
Figure 4E:
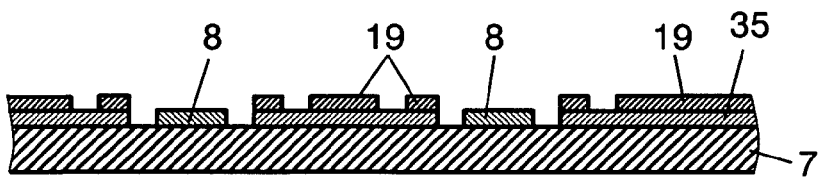
FIG. 4E is a manufacturing process diagram of a SAW duplexer in the first exemplary embodiment.

In the next step shown in FIG. 4D, $SiO_2$ is formed by sputtering and other method over the entire top surface of component substrate 7. In the subsequent step, component substrate 7 is immersed in a removal liquid and the like. Then, photosensitive resin layer 18 dissolves and drops off component substrate 7. As a result, as shown in FIG. 4E, $SiO_2$ remains only on the portions where no photosensitive resin layer 18 exists, namely, on the areas except IDT electrodes 8 and extraction electrode 35. The remaining $SiO_2$ is used as bonding section 19.

Figure 4F:
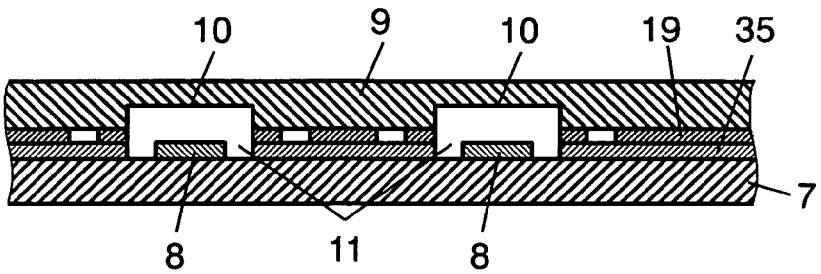
FIG. 4F is a manufacturing process diagram of a SAW duplexer in the first exemplary embodiment.

On the other hand, in the step shown in FIG. 4F, recesses 10 are formed on component cover 9 by dry etching or sand blasting on the lower surface of that part of a silicon plate opposite IDT electrode 8. Next, an assembly of SAW duplexer 6 is formed by direct inter-atomic bonding of component cover 9 and component substrate 7 at room temperature through bonding section 19. In this exemplary embodiment, the step of bonding component cover 9 is carried out in a vacuum.

Figure 5A:
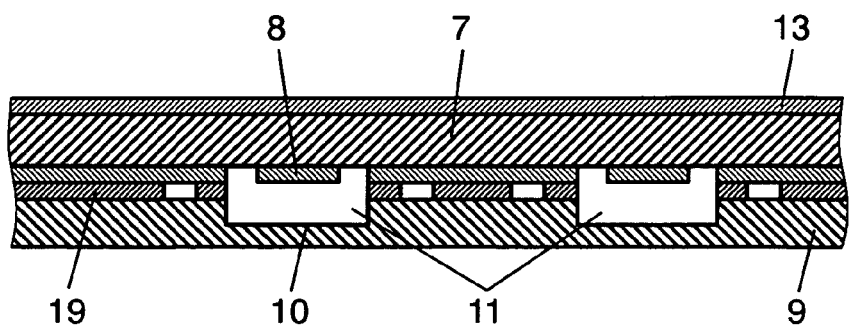
FIG. 5A is a manufacturing process diagram of a SAW duplexer in the first exemplary embodiment.

In the next step shown in FIG. 5A, the assembly of SAW duplexer 6 is reversed and protection layer 13 is disposed on the top surface of component substrate 7. In doing this, it is preferable to bond protection layer 13 and component substrate 7 while slightly pressing protection layer 13 (with a pressure of 2 atm to 3 atm, for example) so that they adhere tightly.

Figure 5B:
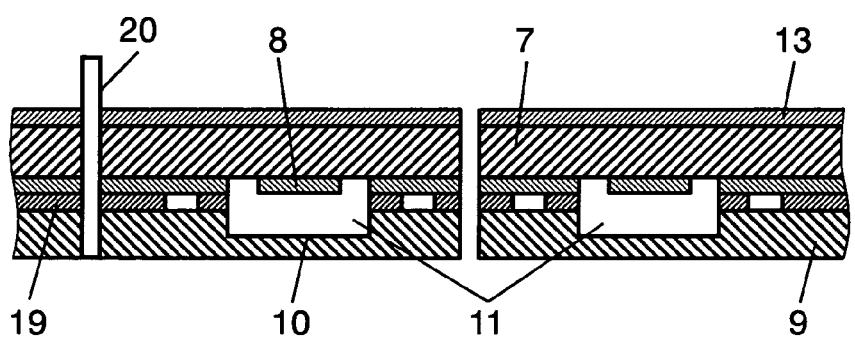
FIG. 5B is a manufacturing process diagram of a SAW duplexer in the first exemplary embodiment.

Subsequently, in the step shown in FIG. 5B, the assembly is cut with rotary cutter 20 from the top of protection layer 13 down to the lower surface of component cover 9 to obtain individual electronic components. Rotary cutter 20 is coated with abrasive grains with grain count in the range from GC#1000 to #2000. The preferred cutting speed of rotary cutter 20 is about 10 mm/sec (spindle speed being 5,000 to 6,000 rpm).

FIG. 6 is a sectional view of SAW duplexer 6 as taken along arrow 6 in FIG. 3 in the first exemplary embodiment. In the step shown in FIG. 6, through hole 21 is provided on component cover 9 by dry etching. Subsequently, metal films are formed on the inner surface of through hole 21 by sequentially evaporating Ti, Ni, and Au. In addition, external terminal connecting section 22 is formed by printing solder in the through hole 21 in which the metal films are formed.

Figure 7:
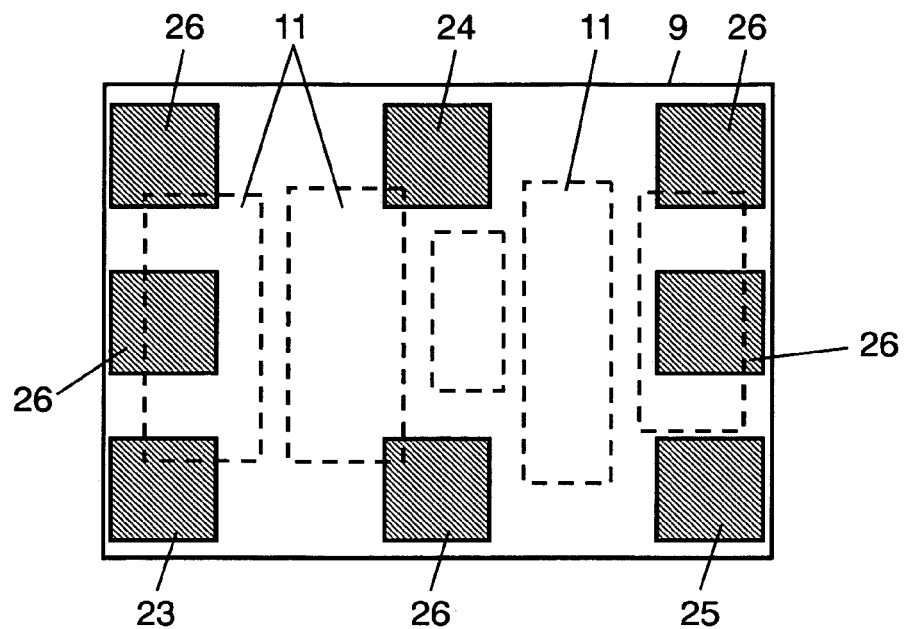
FIG. 7 is a bottom view of a component cover in the first exemplary embodiment.

Next, in the step shown in FIG. 7, reception terminal 23, antenna terminal 24, transmission terminal 25, and grounding terminal 26 are formed on the lower surface of external terminal connection section 22, that are to be connected to external terminal 15 of mounting board 14. FIG. 7 is a bottom view of component cover 9 in the first preferred embodiment. FIG. 7 shows layout of reception terminal 23, antenna terminal 24, transmission terminal 25, and grounding terminal 26 that are to be joined with external electrode 15.

In the subsequent step shown in FIG. 1, afore-mentioned SAW duplexer 6 is mounted on mounting board 14 through external electrode 15. SAW duplexer 6 is then housed into a mold. Heated molding resin 16 at a temperature of 175 degree C. is injected into the mold with an injection pressure of 50 to 100 atm and is subsequently cooled thus forming an electronic component package.

Next, a detailed description will be given of the function of the work-affected layer 12 as an intermediate elastic layer 17 on the side of component substrate 7 and made as described above and shown in FIG. 2. Work-affected layer 12 is formed in the cutting/separating step of wafer-shaped SAW duplexer 6 using rotary cutter 20 shown in FIG. 5B. To be more specific, by choosing grain count of rotary cutter 20 in the range GC#1000 to #2000, fine irregularities are formed on the cut surface as shown in FIG. 2. And, a hybrid structure is formed as molding resin 16 enters into the irregularities. As a result, work-affected layer 12 having an elastic modulus of that portion smaller than that of component substrate 7 and greater than that of molding resin 16 can be formed. Accordingly, intermediate elastic layer 17 can be easily provided on the side of component substrate 7 without need for a dedicated step.

Figure 8:
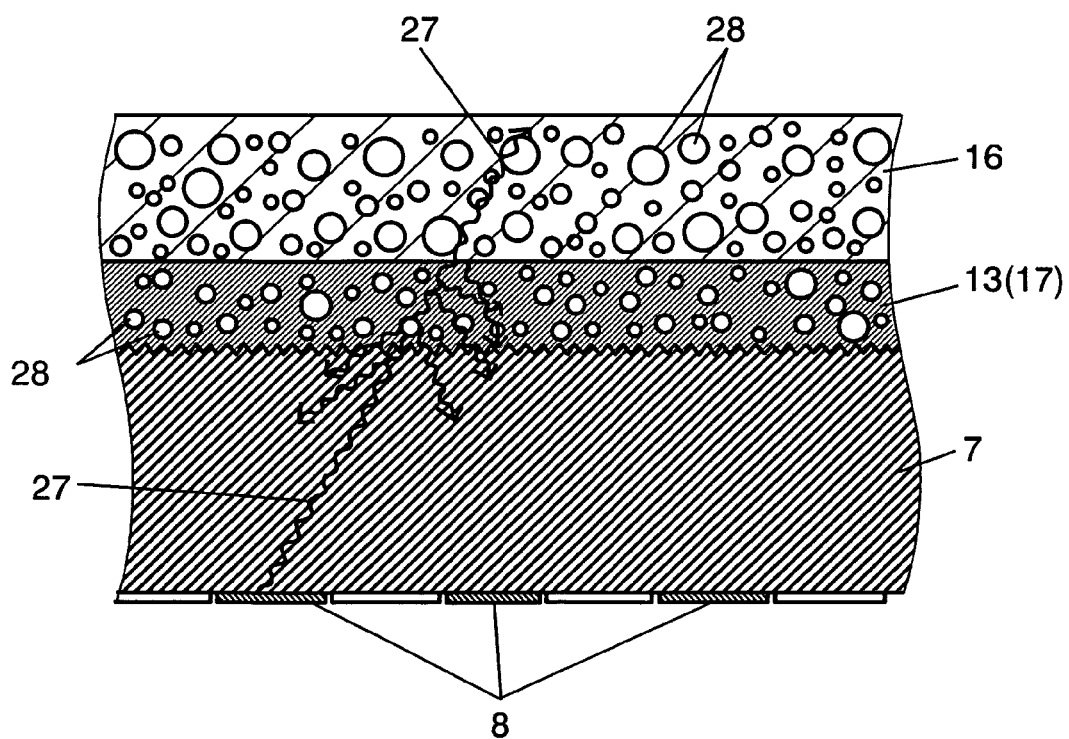
FIG. 8 is a schematic diagram showing transmission and attenuation of bulk waves that propagate inside an electronic component.

Next, a description will be given with reference to FIG. 8 on the function of protection layer 13 that serves as intermediate elastic layer 17 on the top surface of component substrate 7. FIG. 8 is a schematic diagram to show transmission and attenuation of the bulk waves that propagate inside an electronic component. As described above, protection layer 13 can be easily formed by disposing protection layer 13 on the surface of wafer-shaped assembly and lightly pressing it.

When disposing protection layer 13 on the top surface of component substrate 7, if protection layer 13 is simply disposed with a normal pressure, there will occur a case in which protection layer 13 and component substrate 7 do not tightly adhere, leaving air in the irregularities. In such a case, as the acoustic impedance of air greatly differs from that of component substrate 7, most of bulk waves 27 are reflected at the interface of component substrate 7 and protection layer 13. However, when protection layer 13 is slightly pressed while disposing it (with a pressure of 2 atm to 3 atm, for example), protection layer 13 enters into the irregularities of component substrate 7, too, as there are fine irregularities as shown in FIG. 8 on the side surface of component substrate 7 due to abrasive machining. The degree of adhesion can thus be enhanced. Accordingly, the intervention of air that has an acoustic impedance greatly different from that of component substrate 7 can be minimized. As a result, the amount of transmission of bulk waves 27 from component substrate 7 to protection layer 13 can be increased. Consequently, as bulk waves 27 generated at IDT electrodes 8 on the input side become difficult to propagate to IDT electrodes 8 on the output side, namely, the accumulated amount of attenuation of bulk waves 27 increases, the frequency characteristics of SAW duplexer 6 can be improved.

Furthermore, thinning of electronic components can be achieved owing to protection layer 13. It has heretofore been necessary to increase the thickness of component substrate 7 and to increase the transmission distance of bulk waves in order to attenuate the above-described bulk waves 27. However, as protection layer 13 of this exemplary embodiment is made of resin different from component substrate 7 of a single-crystal structure, its molecular structure lacks regularity. Accordingly, the quantity of attenuation of bulk waves 27 is greater in protection layer 13 than in component substrate 7. For this reason, when to obtain the same attenuation rate of bulk waves 27, the electronic component can be made thinner when protection layer 13 is provided than with component substrate 7 alone.

In this exemplary embodiment, an epoxy resin containing filler 28 was used as protection layer 13 as shown in FIG. 8. However, other material may also be used so far as its adhesion with component substrate 7 is good and its elastic modulus is enough to suppress flexure of component substrate 7. Here, when using resin as protection layer 13, it is preferable to put filler 28 in the resin to make the elastic modulus equal to or greater than 3 GPa because the elastic modulus of resin tapes in general without filler 28 is lower than 3 GPa. Also, when using an epoxy resin, the content of filler 28 is preferably in the range 20 wt % to 50 wt % as an excessive content of filler 28 impairs adhesiveness.

Second Exemplary Embodiment

Figure 9:
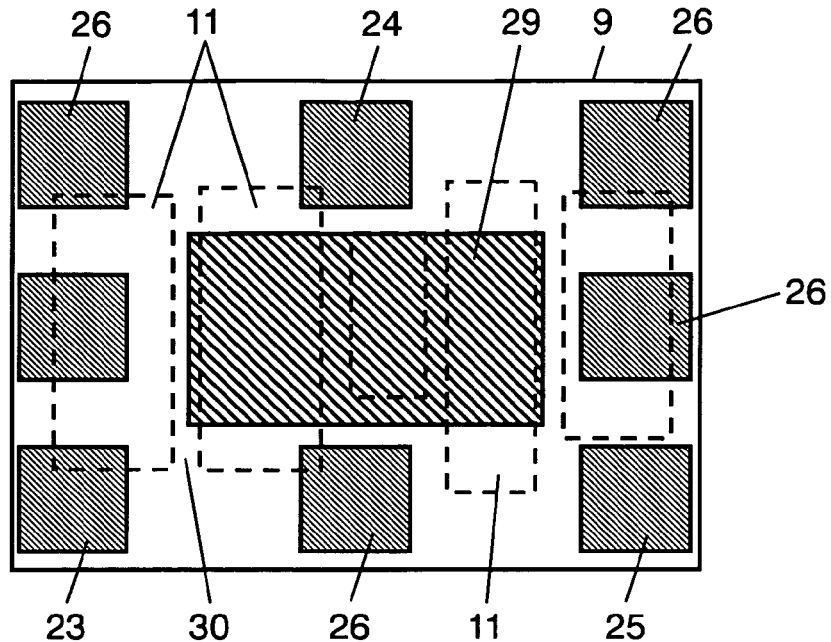
FIG. 9 is a bottom view of a component cover in a second exemplary embodiment.

Referring to drawings, a description will be given on an electronic component package in a second exemplary embodiment of the present invention. FIG. 9 is a bottom view of component cover 9 in the second exemplary embodiment. What is different in the second exemplary embodiment from the first exemplary embodiment is that dummy electrode 29 is provided at a part downward of cavity 11 as shown in FIG. 9. With this structure, damage of SAW duplexer 6 due to an external pressure can be suppressed. This structure is especially effective with a thin and fragile electronic component having cavity 11 as it is necessary to depress when providing protection layer 13.

To be more specific, as dummy electrode 29 works as a support between mounting board 14 and SAW duplexer 6, an external pressure applied to component cover 9 can be effectively dispersed. As a result, the strength of the electronic component package against an external pressure is enhanced thus preventing damage of SAW duplexer 6.

Also, when forming plural IDT electrodes 8 on component substrate 7, a single cavity 11 may be provided so as to cover all IDT electrodes 8. However, cavity 11 may be formed for each one or two IDT electrodes 8 as in this exemplary embodiment. By forming plural cavities 11 in this way, the strength of the electronic component package against an external pressure is enhanced and damage to SAW duplexer 6 can be suppressed.

That is, when there is no support to the part of cavity 11, an external pressure applied to component substrate 7 and component cover 9 may cause damage such as breakage in the direction toward cavity 11. However, by dividing cavity 11 into plural sections, partition 30 is formed between cavities 11, which functions as a support and disperses the external pressure. Partition 30 may be arbitrarily formed inside cavity 11 with resin or other material.

Also, while these plural cavities 11 may be formed as completely discrete units, they may be partially coupled through a tunnel-like channel (not shown) between cavities 11. By providing such a channel, an excessive pressure applied to a part of cavity 11 may be dispersed to other cavity 11 through the channel. As a result, strength of an electronic component package against an external pressure can be enhanced.

Also, SAW duplexer 6 in the second exemplary embodiment may be provided with dummy electrode 29 at a position opposite IDT electrode 8 and the dummy electrode 29 may be joined with external electrode 15 on mounting board 14. By employing such a configuration, the gap between component cover 9 and mounting board 14 beneath cavity 11 can be made smaller, and the amount of molding resin 16 that may enter can be reduced. Consequently, the pressure applied during molding process in the direction from below component cover 9 to cavity 11 can be reduced and damage of component cover 9 can be suppressed.

As other structures, manufacturing method, operation, and advantage are the same as in the first exemplary embodiment, the description is omitted.

Third Exemplary Embodiment

Figure 10:
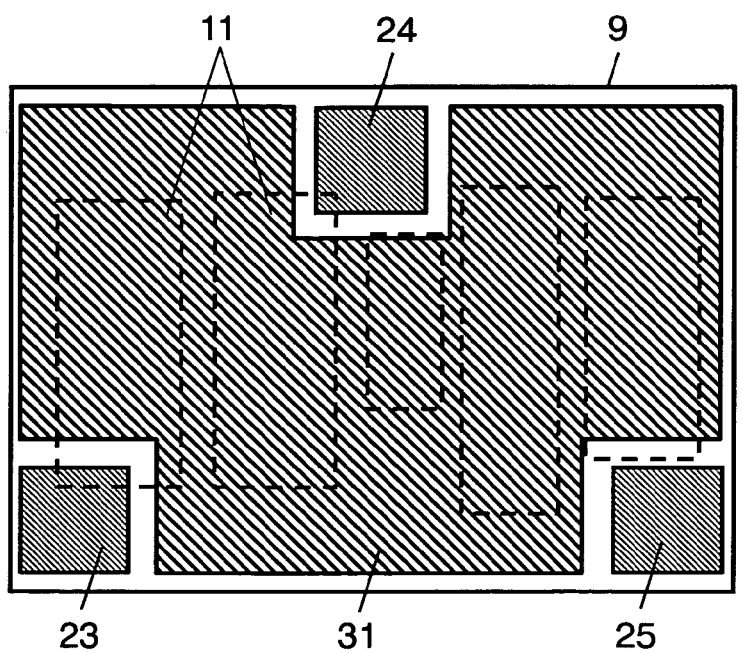
FIG. 10 is a bottom view of a component cover in a third exemplary embodiment.

A description of an electronic component package in the third exemplary embodiment of the present invention will be given with reference to drawings. FIG. 10 is a bottom view of component cover 9 in the third exemplary embodiment. What is different in the third exemplary embodiment from the first exemplary embodiment is that grounding terminals 26 are merged into one and a large grounding terminal 31 is provided over essentially the entire surface excluding reception terminal 23, antenna terminal 24 and transmission terminal 25.

With this structure, grounding terminal 31 functions as a support between component cover 9 and mounting board 14 thereby effectively dispersing an external pressure and preventing damage of SAW duplexer 6.

A structure like this is especially effective for such a fragile electronic component as thin and having cavity 11 because it is necessary to depress the electronic component when providing protection layer 13.

Also, the presence of grounding terminal 31 saves the amount of molding resin 16 that enters between component cover 9 and mounting board 14 by the amount equal to its volume, and suppresses the pressure applied from below component cover 9.

As other structures, manufacturing method, operation, and function are the same as in the first exemplary embodiment, description of them is omitted.

Figure 11:
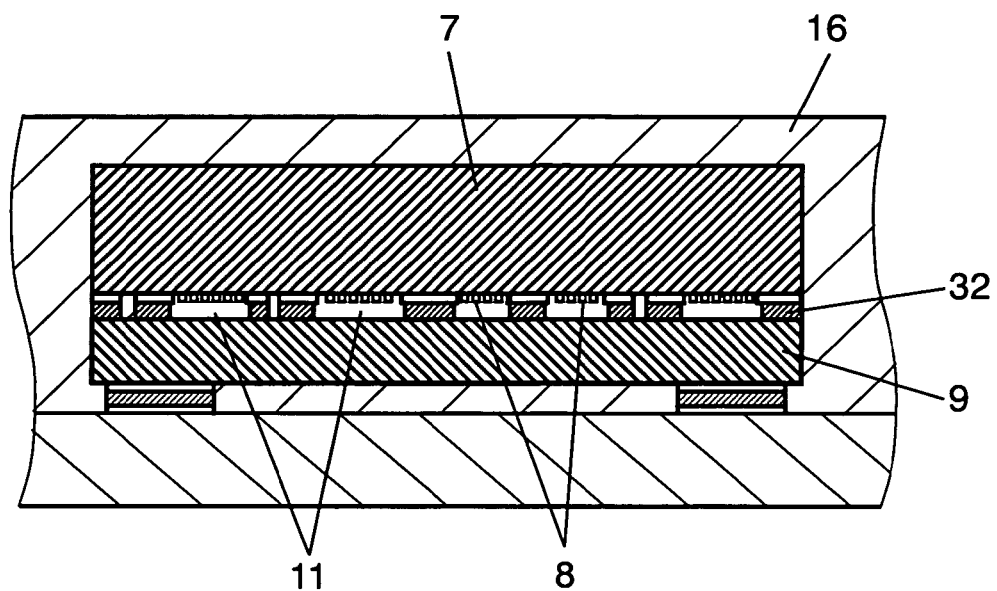
FIG. 11 is a sectional view of an electronic component package in another exemplary embodiment.
Figure 12:
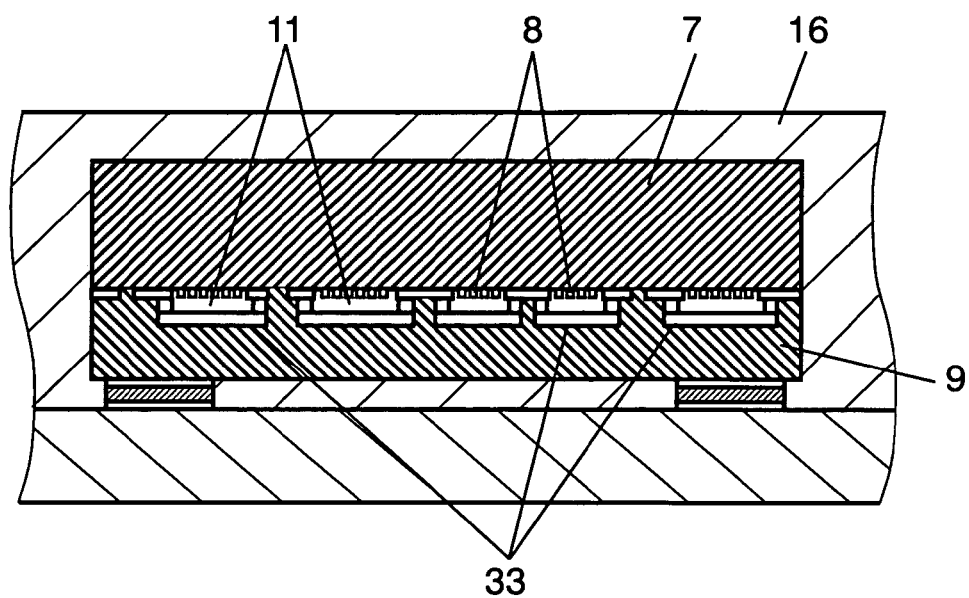
FIG. 12 is a sectional view of an electronic component package in still another exemplary embodiment.
Figure 13:
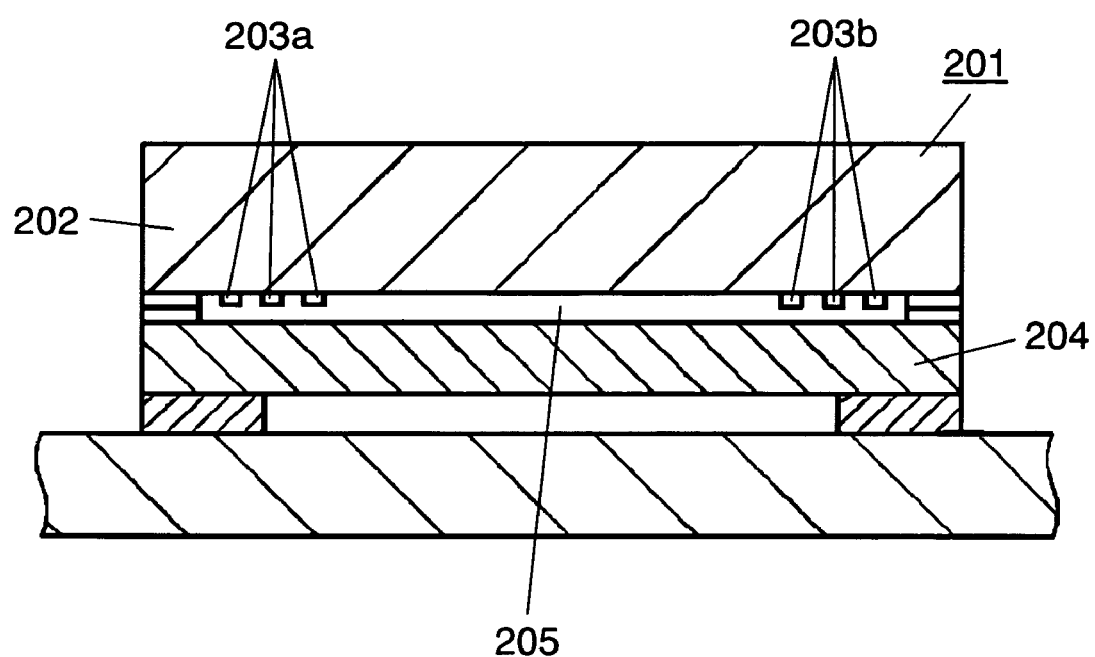
FIG. 13 is a sectional view of a conventional electronic component package.

By the way, though silicon is used for component cover 9 in the first to the third exemplary embodiments, an epoxy resin containing filler, sapphire, quartz, glass, crystal, or other materials may also be used for component cover 9. Furthermore, as shown in FIG. 11, cavity 11 may be formed by using a flat plate having no recess as component cover 9, and providing bonding section 32 consisting of a metal such as aluminum or $SiO_2$ between component cover 9 and component substrate 7. In addition, device cover 33 that covers the lower part of a device (IDT electrodes 8) may be provided and its peripheral may be covered with component cover 9 as shown in FIG. 12. Component cover 9 has an advantage of protecting IDT electrodes 8 from corrosion due to oxidation or moisture.

What is claimed is:
1. An electronic component package comprising:
   a mounting board;
   an external electrode disposed on said mounting board;
   an electronic component mounted on said mounting board through said external electrode, said electronic component including:
      a component substrate formed of a piezoelectric material;
      an IDT electrode disposed on a lower surface of said component substrate; and
      a component cover covering a lower part of said component substrate; and
   molding resin covering said electronic component on said mounting board,
   wherein, an intermediate elastic layer having an elastic modulus smaller than that of said component substrate and greater than that of said molding resin is provided between said component substrate and said molding resin.
2. The electronic component package of claim 1, wherein a work-affected layer is formed by plastically deforming a side of said component substrate by cutting, and said work-affected layer is used as the intermediate elastic layer.
3. The electronic component package of claim 1, wherein a protection layer having an elastic modulus smaller than that of said component substrate and greater than that of said molding resin is disposed as said intermediate elastic layer between said component substrate and said molding resin.

* * * * *